(12) United States Patent
Bierhuizen et al.

(10) Patent No.: US 7,652,301 B2
(45) Date of Patent: Jan. 26, 2010

(54) OPTICAL ELEMENT COUPLED TO LOW PROFILE SIDE EMITTING LED

(75) Inventors: Serge J. Bierhuizen, Santa Rosa, CA (US); Gregory W. Eng, Fremont, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 212 days.

(21) Appl. No.: 11/840,129

(22) Filed: Aug. 16, 2007

(65) Prior Publication Data

US 2009/0045416 A1   Feb. 19, 2009

(51) Int. Cl.
*H01L 27/15* (2006.01)
(52) U.S. Cl. .......... 257/98; 257/E33.055; 257/E33.068
(58) Field of Classification Search ................... 257/98, 257/99, E33.065, E33.055, E33.067, E33.068, 257/E33.072, E33.062; 438/26–29, 116; 313/110
See application file for complete search history.

(56) References Cited

U.S. PATENT DOCUMENTS

| | | | | |
|---|---|---|---|---|
| 5,813,752 A | * | 9/1998 | Singer et al. ................. | 362/293 |
| 6,069,440 A | * | 5/2000 | Shimizu et al. ............. | 313/486 |
| 6,156,028 A | * | 12/2000 | Prescott ........................ | 606/2 |
| 2005/0194607 A1 | * | 9/2005 | Barnett et al. ................. | 257/99 |

* cited by examiner

*Primary Examiner*—Sue Purvis
*Assistant Examiner*—Shweta Mulcare
(74) *Attorney, Agent, or Firm*—Patent Law Group; Brian Ogonowsky (57) ABSTRACT

A low profile, side-emitting LED with one or more optical elements, such as a reflector or lens, optically coupled to each light emitting sidewall is described. In one embodiment, a reflector is used to redirect the light emitted from each sidewall to a forward direction, e.g., in a flash configuration. In another embodiment, a lens is used to collimate the side emitted light in the horizontal plane, e.g., for backlighting. Each entrance surface of the lens is positioned so that the bottom edge is at or below the bottom of the light emitting sidewall so that the base of the lens does not block light that is emitted by the LED.

42 Claims, 7 Drawing Sheets

OPTICAL ELEMENT COUPLED TO LOW PROFILE SIDE EMITTING LED

FIELD OF THE INVENTION

This invention relates to illumination devices using non-lasing light emitting diodes (LEDs) and, in particular, to techniques for improved coupling of an optical element, such as a lens or reflector, to side-emitting LEDs.

BACKGROUND

Liquid crystal displays (LCDs) are commonly used in cell phones, personal digital assistants (PDAs), portable music players, laptop computers, desktop monitors, and television applications. One embodiment of the present invention deals with a color or monochrome, transmissive LCD that requires backlighting, where the backlight may use one or more LEDs emitting white or colored light. The LEDs are distinguished from laser diodes in that the LEDs emit incoherent light.

In many small displays, such as for cell phones, it is important that the display and backlight be thin. Further, since such small displays are typically battery operated, it is important that the light from the LED be efficiently directed to the back surface of the LCD. It is also important that the light from the LED be substantially uniformly emitted by the backlight so as not to distort the brightness of an image displayed by the LCD, which may be beneficial, e.g., in a television. Another application in which a thin but efficiently directed light source is used is flash, e.g., for cameras and particularly cell phone cameras.

SUMMARY

A low profile, side-emitting LED with one or more optical elements, such as a reflector or lens, optically coupled to each light emitting sidewall is described. Each optical element has a bottom edge, wherein light directed at the optical element below the bottom edge will not enter the optical element. The bottom edge of each optical element is positioned at or below the bottom of the light emitting sidewall of the LED.

In one embodiment, the side-emitting LED includes an active layer and a reflective layer overlying the active layer and light emitting sidewalls between the active layer and the reflector layer. One or more optical elements are optically coupled to all of the light emitting sidewalls of the LED. The optical elements include an entrance area that receives light. The area between the active layer and a bottom surface of the reflector layer in the LED is wholly located within the entrance area of the at least one optical element.

In one embodiment, a single optical element, such as a reflector, is used to redirect the light emitted from each sidewall to a forward direction, e.g., in a flash configuration. In another embodiment, a separate optical element, such as a lens, associated with the light emitting sidewalls is used to collimate the side emitted light in the horizontal plane, e.g., for backlighting.

DETAILED DESCRIPTION

Embodiments of the present invention comprise low profile side-emitting LEDs in conjunction with optical elements, such as a reflector, lens or collimating element. One application for the invention is as a thin backlight in an LCD, but other applications exist and will be recognized in light of the present disclosure.

Figure 1:
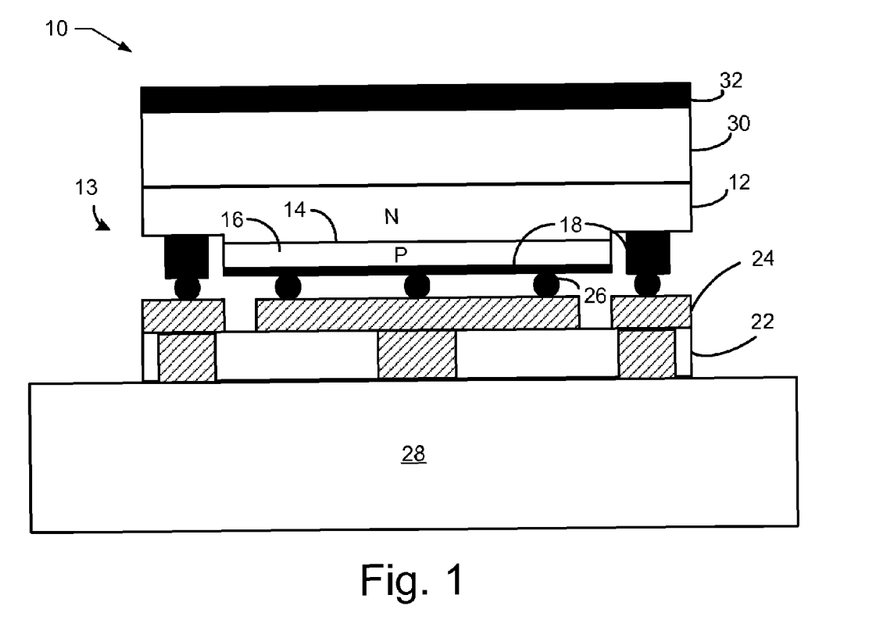
FIG. 1 is a cross-sectional view of one embodiment of a thin, side-emitting LED mounted on a submount.

FIG. 1 is a cross-sectional view of one embodiment of a thin, side-emitting LED 10 that includes a semiconductor light emitting element 13, a wavelength converting element 30, and a reflective film 32. The side emitting LED 10 is mounted on a submount 22, which is mounted on a printed circuit board 28. Other embodiments of thin, side-emitting LEDs that may be used in the backlight embodiments can be found in U.S. application Ser. No. 11/423,419, entitled Low Profile Side Emitting LED, filed Jun. 9, 2006, by Oleg Shchekin et al., assigned to the present assignee, and incorporated herein by reference.

The active layer of the LED 10 in one example generates blue light. The LED 10 is formed on a starting growth substrate, such as sapphire, SiC, or GaN. Generally, an n-layer 12 is grown followed by an active layer 14, followed by a p-layer 16. The p-layer 16 is etched to expose a portion of the underlying n-layer 14. Reflective metal electrodes 18 (e.g., silver, aluminum, or an alloy) are then formed over the surface of the LED to contact the n and p layers. When the diode is forward biased, the active layer 14 emits light whose wavelength is determined by the composition of the active layer (e.g., AlInGaN). Forming such LEDs is well known and need not be described in further detail. Additional detail of forming LEDs is described in U.S. Pat. No. 6,828,596 to Steigerwald et al. and U.S. Pat. No. 6,876,008 to Bhat et al., both assigned to the present assignee and incorporated herein by reference.

The semiconductor light emitting element 13 is then mounted on a submount 22 as a flip chip. The submount 22 contains metal electrodes 24 that are soldered or ultrasonically welded to the metal 18 via solder balls 26. Other types of bonding can also be used. The solder balls 26 may be deleted if the electrodes themselves can be ultrasonically welded together.

The submount electrodes 24 are electrically connected by vias to pads on the bottom of the submount 22 so the submount 22 can be surface mounted to metal pads on a printed circuit board 28. Metal traces on the circuit board 28 electrically coupled the pads to a power supply. The submount 22 may be formed of any suitable material, such as alumina nitride, ceramic, silicon, alumina, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and a power supply, and provides heat sinking. Submounts are well known.

To cause the LED 10 to have a very low profile, and to prevent light from being absorbed by the growth substrate, the growth substrate is removed, such as by CMP or using a laser lift-off method, where a laser heats the interface of the GaN and growth substrate to create a high-pressure gas that pushes the substrate away from the GaN. In one embodiment, removal of the growth substrate is performed after an array of LEDs is mounted on a submount wafer and prior to the LEDs/submounts being singulated (e.g., by sawing).

After the growth substrate is removed, and a wavelength converting element 30, such as planar phosphor layer 30, is positioned over the top of the LED for wavelength-converting the blue light emitted from the active layer 14. The phosphor layer 30 may be preformed as a ceramic sheet and affixed to the LED layers, or the phosphor particles may be thin-film deposited, such as by electrophoresis. The phosphor ceramic sheet may be sintered phosphor particles or phosphor particles in a transparent or translucent binder, which may be organic or inorganic. The light emitted by the phosphor layer 30, when mixed with blue light, creates white light or another desired color. The phosphor may be a yttrium aluminum oxide garnet (YAG) phosphor that produces yellow light (Y+B=white), or may be a combination of a red phosphor and a green phosphor (R+G+B=white).

With a YAG phosphor (i.e., Ce:YAG), the color temperature of the white light depends largely on the Ce doping in the phosphor as well as the thickness of the phosphor layer 30.

A reflective film 32 is then formed over the phosphor layer 30. The reflective film 32 is substantially parallel with the top surface of the semiconductor light emitting element 13. The reflective film 32 may be specular or diffusing. A specular reflector may be a distributed Bragg reflector (DBR) formed of organic or inorganic layers. The specular reflector may also be a layer of aluminum or other reflective metal, or a combination of DBR and metal. A diffusing reflector may be formed of a metal deposited on a roughened surface or a diffusing material such as a suitable white paint or a sol-gel solution with TiO2 in silicone. The phosphor layer 30 also helps to diffuse the light to improve light extraction efficiency. In another embodiment, a reflector is spaced away from the LED, such as a reflector supported by the waveguide over the active layer, resulting in the LED still being a side-emitting LED since little (e.g., up to 10%) direct light exits the backlight above the LED.

Although side-emitting lenses are sometimes used to divert all light emitted by a LED's top surface into a circular side-emission pattern, such lenses are many times the thickness of the LED itself and would not be suitable for an ultrathin backlight or other applications where the vertical height is limited.

Processing of the LED semiconductor layers may occur before or after the LED is mounted on the submount 22.

Most light emitted by the active layer 14 is either directly emitted through the sides of the LED, or emitted through the sides after one or more internal reflections. If the top reflector 32 is very thin, some light may leak through the top reflector 32.

In one embodiment, the submount 22 has a thickness of about 380 microns, the semiconductor layers have a combined thickness of about 5 microns, the phosphor layer 30 has a thickness of about 200 microns, and the reflective film 32 has a thickness of about 150 microns, so that the LED plus the submount is less than 1 mm thick. Of course, the LED 10 can be made thicker. The length of each side of the LED is typically less than 1 mm, for example, the length of a side may be 0.6 mm, however, a side length of 1.0 mm may be used, e.g., for higher power applications.

Side-emitting flip-chip LEDs provide a number of advantages when used in lighting systems. In backlights, side-emitting flip chip LEDs allow utilization of thinner waveguides, fewer LEDs, better illumination uniformity, and higher efficiency due to better coupling of light into a waveguide.

In another embodiment of a side-emitting LED (not shown), reflective material may be formed over one or more sides of the phosphor layer perpendicular to the semiconductor LED layers. Light then is emitted through the uncovered sides of the phosphor layer, which may then enter a backlight waveguide. Any LED that emits light within primarily a narrow area and/or angle between the top and bottom surfaces of the LED is considered a side-emitting LED in this disclosure.

Figure 2A:
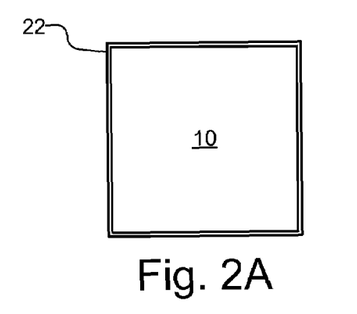
FIGS. 2A and 2B illustrate respective top plan and side views of a LED on a submount.
Figure 2B:
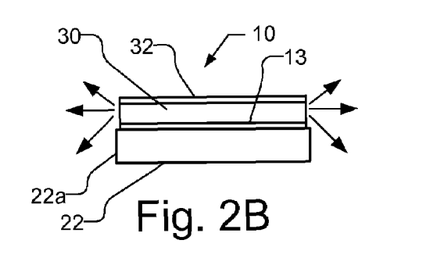

FIGS. 2A and 2B illustrate respective top plan and side views of LED 10 with submount 22. As can be seen in FIG. 2A, the length of the sides of LED 10 is approximately the same as the sides of submount 22. Ideally, the LED 10 and submount 22 would have the same horizontal dimensions (or submount 22 would be smaller), but in practice, due to the need to dice the submount 22 without harming the LED 10, the submount 22 extends horizontally beyond the LED 10 by 5 μm to 150 μm along all light emitting edges of the LED 10. As illustrated in FIG. 2B, with edge 22a of the submount 22 near the light emitting edge of the LED 10, the submount 22 does not interfere with light emitted by the LED 10 along the horizontal direction, illustrated by arrows.

Figure 3A:
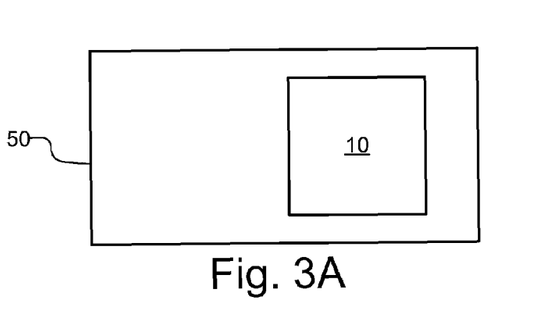
FIGS. 3A and 3B illustrate respective top plan and side views of a LED on a large submount.
Figure 3B:
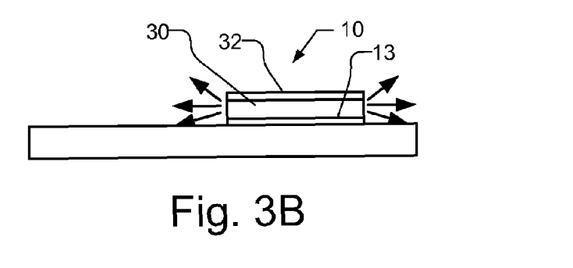

In contrast, FIGS. 3A and 3B illustrate respective top plan and side views of LED 10 with a large submount 50. As can be seen, the submount 50 extends horizontally beyond the LED 10 by a relatively large amount, e.g., greater than 150 μm. FIG. 3B illustrates how the submount 50 interferes with a substantial amount of the light emitted by the LED 10, e.g., the light emitted with a downward trajectory. While it is possible to place one, two or even three light emitting sides of the LED 10 near an edge of a large submount 50, the light emitted from at least one side of the LED 10 will be partially blocked by the submount 50. Moreover, with a transient voltage suppression (TVS) diode mounted on the submount 50, additional light will be blocked.

Figure 4:
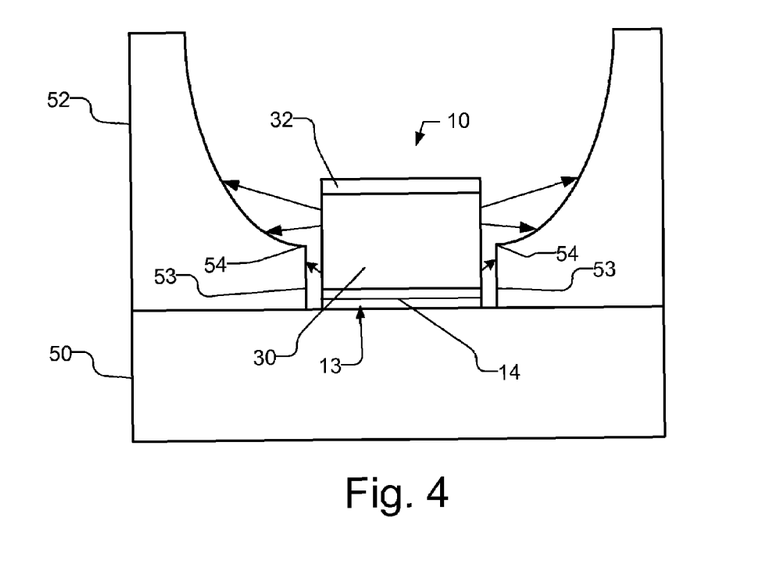
FIG. 4 shows a side view of a LED on a large submount with a reflector that redirects the side emitted light to forward directed light.

FIG. 4 illustrates another problem with the use of a large submount 50. FIG. 4 shows a side view of a LED 10 on large submount 50 with an optical element in the form of a reflector 52 that redirects the side emitted light to forward directed light. The LED 10, i.e., the semiconductor light emitting element 13, the wavelength converting element 30 and the reflective layer 32, has a vertical height of less than 0.4 mm. Due to practical molding issues for the "knife edge" shape at the base 53 of the reflector 52, the base 53 is relatively large compared to the vertical height of the LED 10. Consequently, the bottom edge 54 of the reflector 52 is positioned between the active layer 14 and the reflective film 32 resulting in a large area of the light emitting sidewall of the LED 10 being blocked by the base 53 of the reflector 52.

Figure 5:
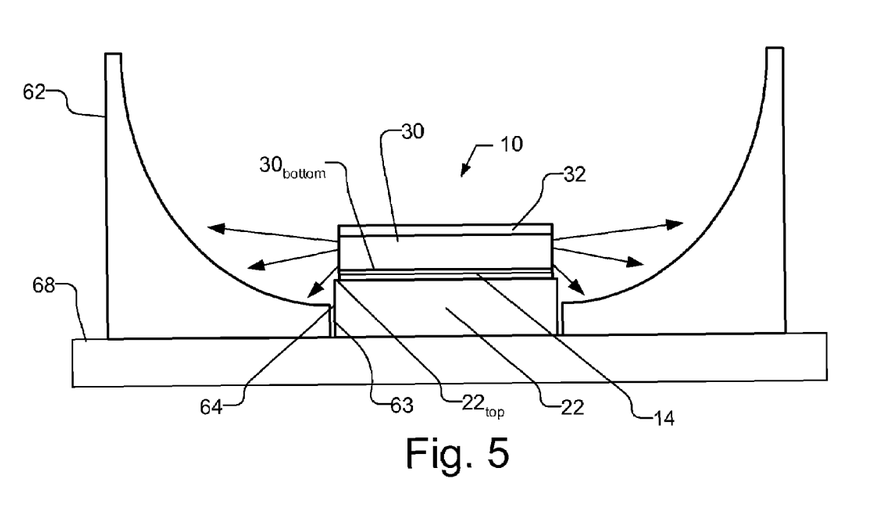
FIG. 5 shows a side view of a LED and a reflector in accordance with an embodiment of the present invention.

FIG. 5 illustrates an embodiment in which the LED 10 is mounted on submount 22 with an optical element in the form of a reflector 62 that is similar to the reflector shown in FIG. 4, but is not mounted on the submount 22. The reflector 62 may be mounted on the printed circuit board 28 (shown in FIG. 1). Alternatively, the reflector 62 may be part of a molded lead frame 68. The molded lead frame 68 may be conventionally produced, e.g., from patterned conductor materials, such as copper. Plastic is injection molded around the conductor material to form the molded lead frame, and is also molded to form the optical element, e.g., reflector 62. The internal surfaces of the reflector 62 may be covered with a reflective coating, such as aluminum or silver.

The reflector 62 redirects the side emitted light to forward directed light, e.g., in a camera flash configuration. As seen in FIG. 5, the bottom edge 64 of the reflector 62 is positioned below the top surface $22_{top}$ of the submount 22. In one embodiment, the bottom edge 64 of the reflector is positioned at the same vertical height as the top surface $22_{top}$ of the submount 22. In another embodiment, the bottom edge 64 may be positioned at or below the active layer 14. Alternatively, the bottom edge 64 may be positioned at or below the bottom surface $30_{bottom}$ of the phosphor layer 30, which emits most of the side emitted light. Thus, the area of the light emitting sidewall of the LED 10, e.g., between the active region 14 and the bottom surface of the reflective layer 32, is wholly located within the light entrance area of the reflector 62 so that light emitted from the sidewall is not blocked by the base 63 of the reflector 62.

Figure 6:
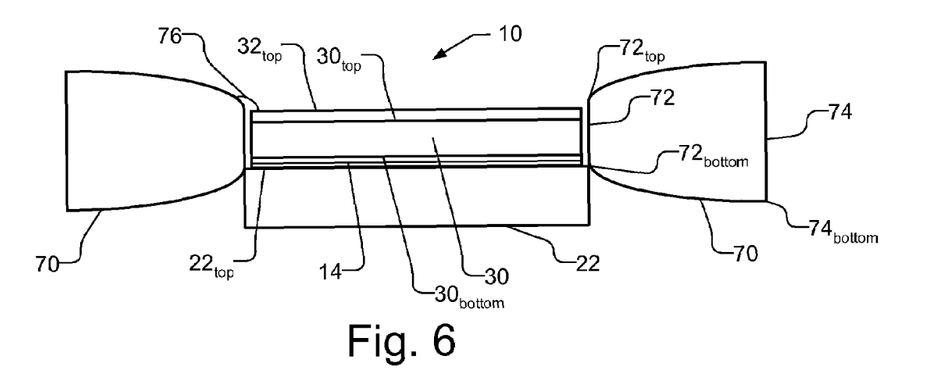
FIG. 6 shows a side view of a LED and a lens in accordance with another embodiment of the present invention.
Figure 7A:
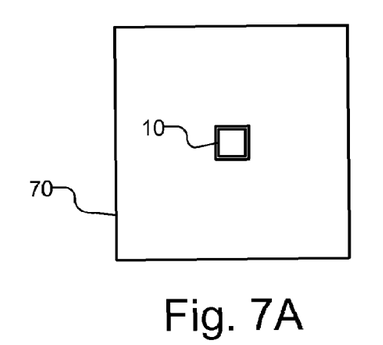
FIGS. 7A and 7B illustrate top plane views of a square and circular configuration of the lens from FIG. 6.
Figure 7B:
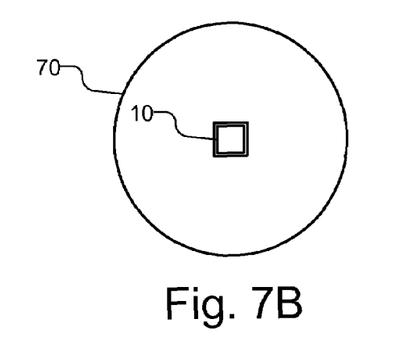

FIG. 6 illustrates another embodiment, in which the LED 10 is mounted on submount 22 with an optical element in the form of a lens 70 optically coupled to the side of the LED 10. Lens 70 is a collimating optic that collimates the side emitted light in the horizontal plane, which may be used for back lighting. FIGS. 7A and 7B illustrate top plane views of a square and circular configuration of the lens 70 with the LED 10. As can be seen, the lens 70 is coupled to each light emitting side of the LED 10, and thus, in the present embodiment where the LED 10 has four light emitting sides, the lens 70 includes four entrance surfaces coupled to each side. If desired, separate individual lenses for each separate light emitting side may be combined to form the lens 70.

Figure 7C:
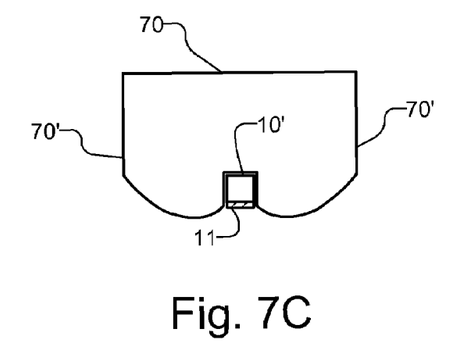
FIG. 7C illustrates a top plan view of a three sided edge emitter LED and a lens used therewith.

FIG. 7C illustrates a top plan view of a three sided edge emitter LED 10' and an appropriate lens 70' used with the LED 10'. The LED 10' is similar to the four sided edge emitter LED 10, but may include, e.g., a reflective layer 11 on one side. The lens 70' is shaped to receive light from the three edge emitting sides and to create a large divergence of the light, e.g., ±90° within the back light plane, and to collimate the light, e.g., ±20°, in the orthogonal direction. The curved shape of the lens 70' is such that it will reflect using Total Internal Reflection (TIR) of light from all angles from the left and right side of the side emitter LED 10'. As is known in the art, TIR occurs when the angle of incidence internal to the medium is $>\text{asin}(n_2/n_1)$, i.e. $>43.6°$ from $n_1=1.45$ to $n_2$ (e.g. 1.0 for air). The lens 70' is in optical contact with the 3 side emitting surfaces by way of, e.g. overmolding or using a bonding material in between the side emitter surfaces and the lens. The bonding material, such as silicone may be applied and permitted to wick in between the lens 70' and the side emitter material of the LED 10'.

The lens 70, illustrated in FIG. 6, includes an entrance area 72 that is optically coupled to the light emitting sides of the LED 10 to receive the side emitted light. The entrance area 72 is the area of the lens that receives light from the LED 10 and in this embodiment includes a top edge $72_{top}$ and bottom edge $72_{bottom}$. The bottom edge $72_{bottom}$ is positioned at the same vertical height as the top surface $22_{top}$ of the submount 22. In another embodiment, the bottom edge $72_{bottom}$ may be positioned at or below the active layer 14. Alternatively, the bottom edge $72_{bottom}$ may be positioned at or below the bottom surface $30_{bottom}$ of the phosphor layer 30, which emits most of the side emitted light. The top edge $72_{top}$ is positioned at or above the bottom surface of the reflective film 32. Thus, the area of the light emitting sidewall of the LED 10, e.g., between the active region 14 and the bottom surface of the reflective layer 32, is wholly located within the entrance area 72 of the lens 70 so that light emitted from the sidewalls is not blocked.

The lens 70 also includes one or more exit surfaces 74 through which the horizontally collimated light is emitted. As illustrated in FIG. 7A, where the lens 70 has a square shape, there are four exit surfaces 74, while FIG. 7B illustrates a round lens 70 with one exit surface. The exit surface 74 may be, e.g., approximately 3 mm in height or less so that it can be used with a thin backlighting operation. As illustrated in FIG. 6, the bottom edge $74_{bottom}$ of the exit surface 74 may be positioned well below the vertical height of the top surface $22_{top}$ of the submount 22. Such a configuration would not be possible with the use of a large submount 50, such as that shown in FIG. 3A.

The lens 70 may be hollow with reflective side walls or solid formed by producing an optically transparent material, such as silicone, glass or plastic, with the desired shape. The side walls of a solid lens may then be coated with a reflective material. When the lens 70 is formed from a solid material, assuming an airgap or lower refractive index material in between the side emitter LED 10 and the lens 70, the light will refract towards the normal of the flat walls of the entrance surface 72 of the higher index medium, resulting in the light intensity near the corners of the LED 10 to be less than the intensity directly in front of the sides of the LED 10.

In one embodiment, the space between the LED 10 and the lens 70 may be filled with a material 76, such as silicone, to increase light extraction and to improve the angular mixing of the light. By way of example, materials with different refractive indices may be used for the fill material 76 and lens 70 to produce a desired angular mix or spread of light as the light enters the lens 70.

Figure 8:
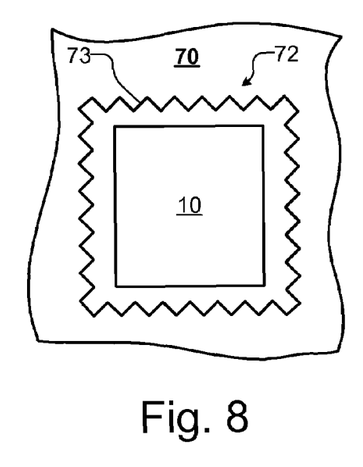
FIG. 8 illustrates a top plan view of the LED with a portion of the lens having an entrance surfaces with vertically oriented varying angled walls to improve the angular mixing of the light.

FIG. 8 illustrates a top plan view of the LED 10 with a portion of the lens 70 having entrance surfaces 72 with vertically oriented angled walls 73, which may also be used to improve the angular mixing of the light within the lens 70. The varying angles of the walls 73 of the entrance surface 72 refract the light emitted by the LED 10 at different angles so the light is spread more evenly. Because the light is being collimated in the horizontal plane, there is no need to produce horizontally oriented angled walls. While FIG. 8 illustrates a saw-tooth configuration for the entrance surface 72, other configurations, such as rounded or scallop shapes may be used. The shape of the sidewalls may also be varied based on the distribution of the extraction features formed on the bottom surface of the waveguide to achieve the most uniform brightness profile at the light output of the backlight.

Figure 9A:
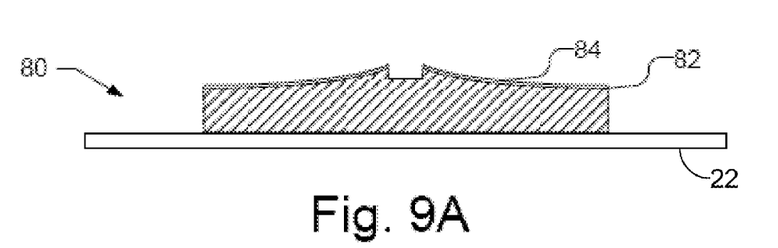
FIGS. 9A-9C illustrate embodiments of manufacturing the lens using a molded lead frame.
Figure 9B:
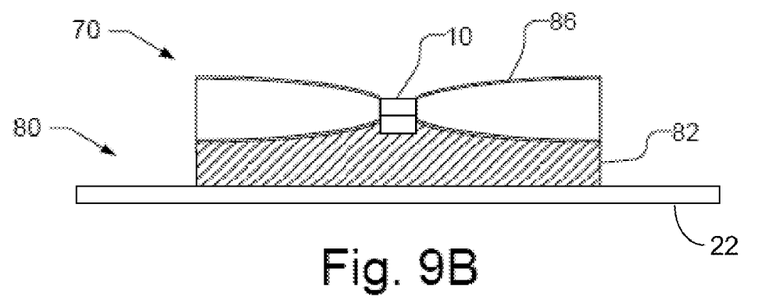
Figure 9C:
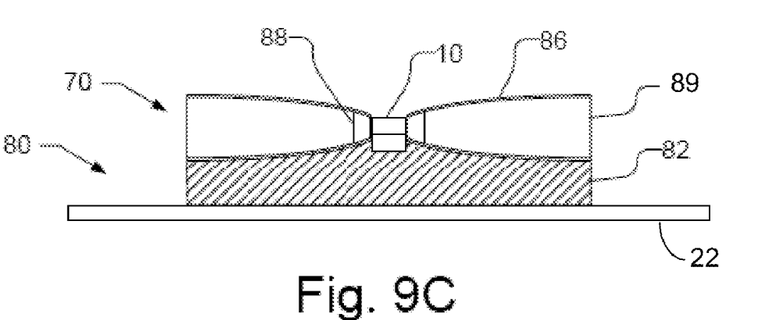

In one embodiment, a molded lead frame may be used with the LED 10 and lens 70. FIGS. 9A and 9B illustrate manufacturing the LED 10 with lens 70 with a molded lead frame 80, in accordance with one embodiment. Molded lead frame 80 is produced from a patterned conductor material with a plastic or other appropriate material injection molded around the conductor material. The injection molded material is molded to form the bottom surface 82 of the lens 70 and coated with a reflective layer 84, such as aluminum or silver. The LED 10 can then be mounted on the lead frame 80 and silicone is deposited and molded to form the lens 70, as illustrated in FIG. 9B. A reflective layer 86, e.g., aluminum or silver, can then be deposited over the lens 70. No reflective coating is necessary or used if the collimator lens 70 design is based on total internal reflection within the lens material. In one embodiment, as illustrated in FIG. 9C, a double overmolding process is used, in which a silicone material 88 with a first refractive index, e.g., 1.6, is deposited and molded. Additional silicone material 89, with a different refractive index, e.g., 1.3, is then deposited and molded to form the desired lens 70. As discussed above, the refractive indices may be selected so that desired refraction occurs as the index step to achieve angular mixing of the light. Moreover, features, such as those shown in FIG. 8 may be molded in the first silicon material 88 to help achieve the desired angular mixing of light.

Figure 9D:
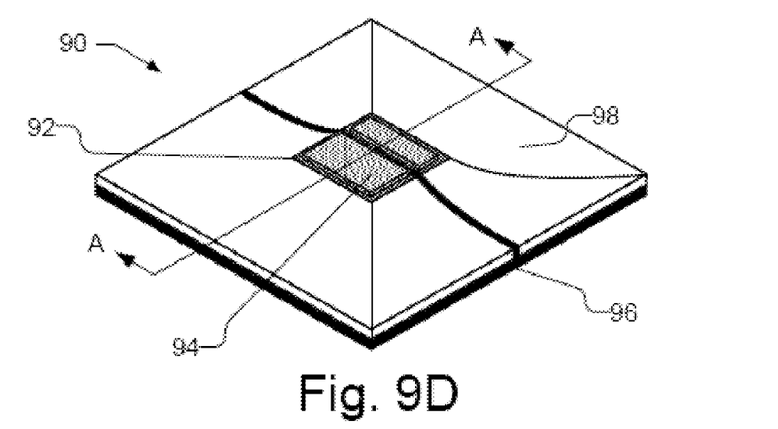
FIGS. 9D and 9E illustrate an embodiment of a shaped substrate.
Figure 9E:
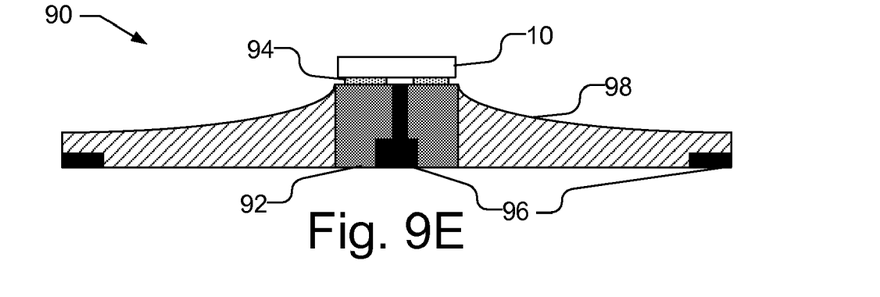

FIGS. 9D and 9E illustrate, respectively, a perspective view and a cross-sectional view (along line A-A in FIG. 9D) of an embodiment of a shaped substrate 90 with which the LED 10 can be directly mounted without the need for a separate submount 22. The shaped substrate 90 includes conductive n and p bases 92 and electrodes 94 that the LED 10 is mounted on (as illustrated in FIG. 9E). The shaped substrate 90 also includes frame 96 manufactured from, e.g., resin coated copper, which is non-conductive, and is therefore sometimes referred to as a copper core substrate. The frame 96 separates the bases 92 and forms the frame for the shaped material 98 that forms the bottom surface of a collimator lens 70. The shaped material 98 may be, e.g., epoxy or plastic or may be a conductor such as copper for improved heat dissipation. As described above, a reflective coating may be deposited over the shaped material 98 followed by overmolding the lens 70 (not shown in FIGS. 9D and 9E) using, e.g., silicone. In one embodiment, a low index of refraction material, e.g., n=1.3, may be used for the shaped material 98 or applied over the shaped material 98, and a high index of refraction material, e.g., n=1.6, may be used for the lens 70, so that lens 70 may rely on total internal reflection, as opposed to a reflective coating.

Figure 10:
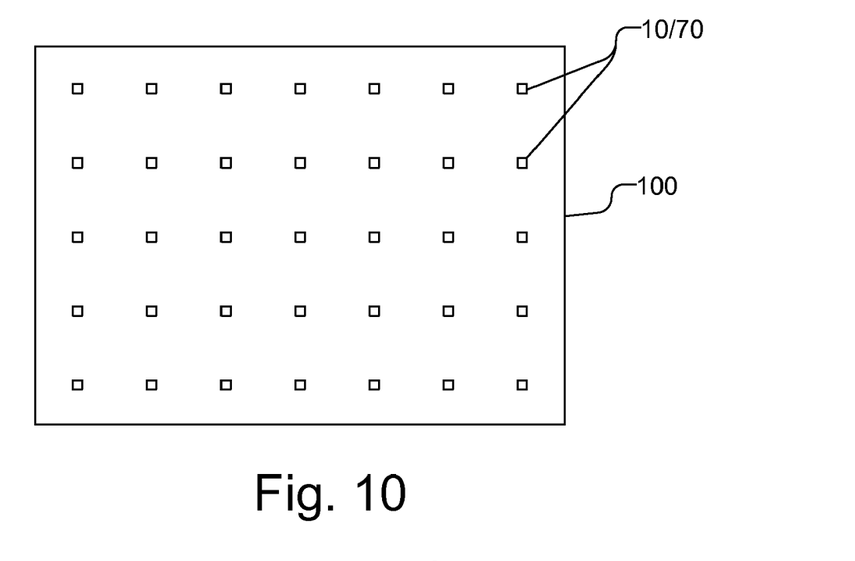
FIG. 10 illustrates a top plan view of a backlight including a distribution of a plurality of LEDs.
Figure 11:
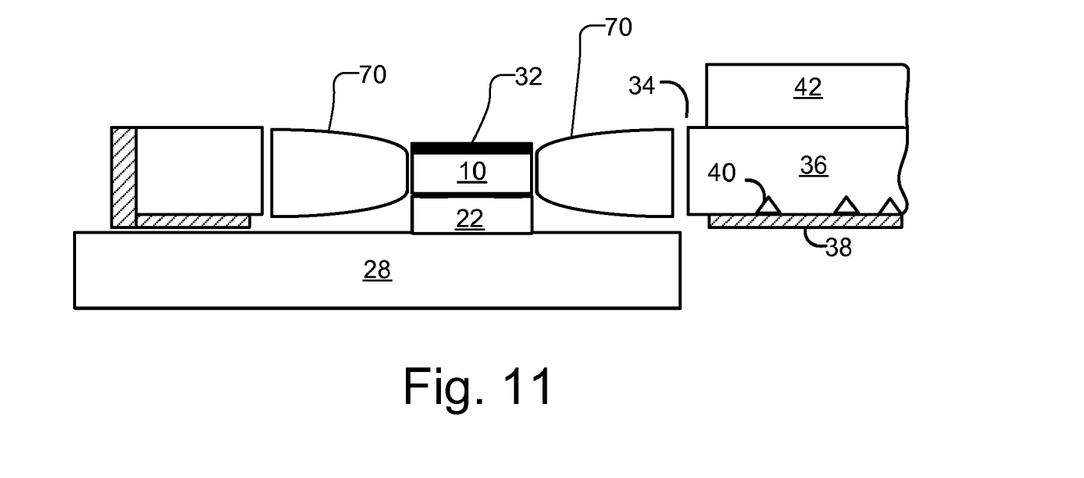
FIG. 11 is a cross-sectional view of a portion of a backlight from FIG. 10.

FIG. 10 illustrates a top plan view of a backlight 100 including a distribution of a plurality of LEDs 10 with lens 70. FIG. 11 is a cross-sectional view of a portion of a backlight 100 cut across the LED 10. In FIG. 11, the side-emitting LED 10, mounted on submount 22 and circuit board 28, and the lens 70 are inserted into a hole 34 in a solid transparent waveguide 36. There is a small air gap, such as 25 microns, between the lens 70 and the walls of the hole to accommodate positioning tolerances. The waveguide 36 may be a hollow cavity, molded plastic (e.g., PMMA) or another suitable material. A mirror film 38 covers the bottom surface and sides of the waveguide 36. The film 38 may be Enhanced Specular Reflector (ESR) film available from 3M Corporation or an external diffuse white scattering plate. It is optional that the mirror film 38 or the external white plate cover the sides. Instead of using a reflective film, the waveguide 36 may be supported in a carrier with reflective side walls.

The bottom surface of the waveguide 36 has many small pits 40 for scattering the light in an upward direction toward the LCD 42 back surface. The LCD 42 selectively controlling pixels in a display screen in a conventional manner. The pits 40 may be created in the molding process for the waveguide 36 or may be formed by etching, sand blasting, printing, or other means. The pits 40 may take any form such as prisms or a random roughening. Such features are sometimes referred to as extraction features. In one embodiment, the density of the pits 40 nearer the LED 10 (where the light from the LED is brighter) is less than the density of the pits 40 further from the LED 10 to create a uniform light emission over the top surface of the waveguide 36. For more information about the backlight and waveguide see U.S. Ser. No. 11/840,130, entitled "Thin Backlight Using Low Profile Side Emitting LED", by Serge Bierhuizen et al., filed herewith, which is incorporated by reference in their entirety.

Figure 12:
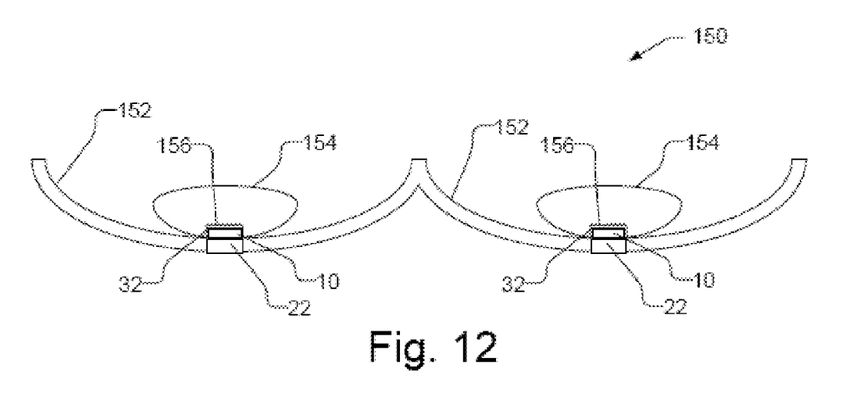
FIG. 12 is a partial cross-sectional view of another type of backlight with optical cells.
Figure 13:
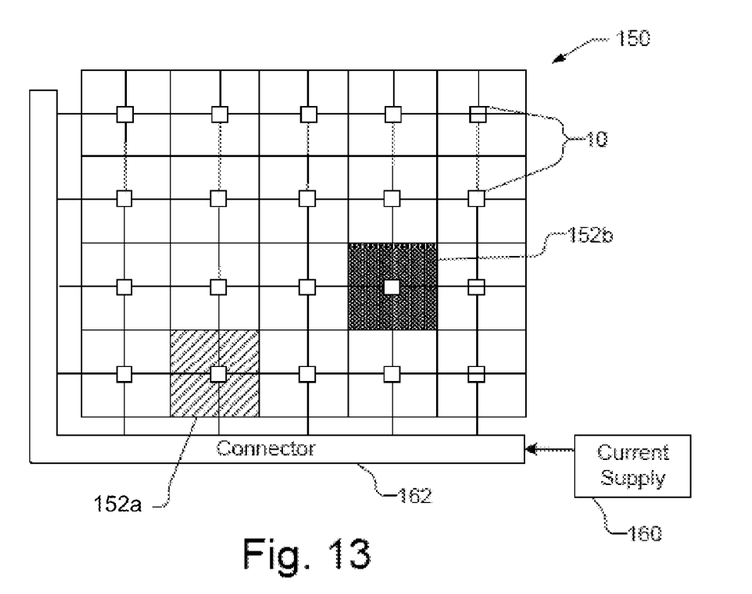
FIG. 13 illustrates a top view of the backlight from FIG. 12.

FIG. 12 is a partial cross-sectional view of another type of backlight 150, where each LED 10 is located in an optical cell 152. FIG. 13 illustrates a top view of the backlight 150. In this embodiment, the backlight 150 is a patterned diffuser plate, which may be one dimensional or two dimensional, and that can be used to control the light distribution. By way of example, the backlight 150 may be a microcellular reflective sheet, such as that manufactured by Furukawa Electric as MCPET, or a highly specular reflector or a partly reflective/scattering element, which has high reflectance and recycling efficiency. A portion of the light from each reflective cell 152, may leak to the adjacent cells, which permits mixing of the light from difference LEDs and therefore improves uniformity of the light, as well as produces non-abrupt boundaries between segments. By way of example, the light mixing between cells can range from e.g. 20% to 80% of the light being contributed from neighboring cells.

The LED 10 may be mounted in the cells 152 with an additional lens 154 that assists in controlling the side emitted light. As can be seen, a scattering element 156 may be positioned over the reflective film 32 of the LED 10. The scattering element 156 converts a portion of forward emitted light, e.g., light that leaks through the reflective film 32, in a horizontal direction. The scattering elements 156 are typically formed by the lens mold. Alternatively, sandblasting, etching, screen-printing, or by other means may be used to form features that redirect light from the vertical direction towards the horizontal direction.

As illustrated in FIG. 13, an array of LEDs 10 is used with the patterned diffuser plate 150. In one embodiment, each LED 10 is independently addressable by row and column to receive a forward biasing current from the current supply 160 via the connector 162. Thus, as illustrated in reflective cell 152a, the LED 10 may be provided with full current so that the LED is on, while in the reflective cell 152b, the LED 10 does not receive any current so that the LED is off. This is advantageous, for example, so that the backlighting can be used to alter the brightness of selected portions of an LCD display. This modular cell-based approach can be used for 2D dimming or boosting systems where the backlight delivers a low-resolution image to significantly enhance the contrast (white/black) ratio locally in combination with the LCD dynamic range and reduces power consumption.

Figure 14:
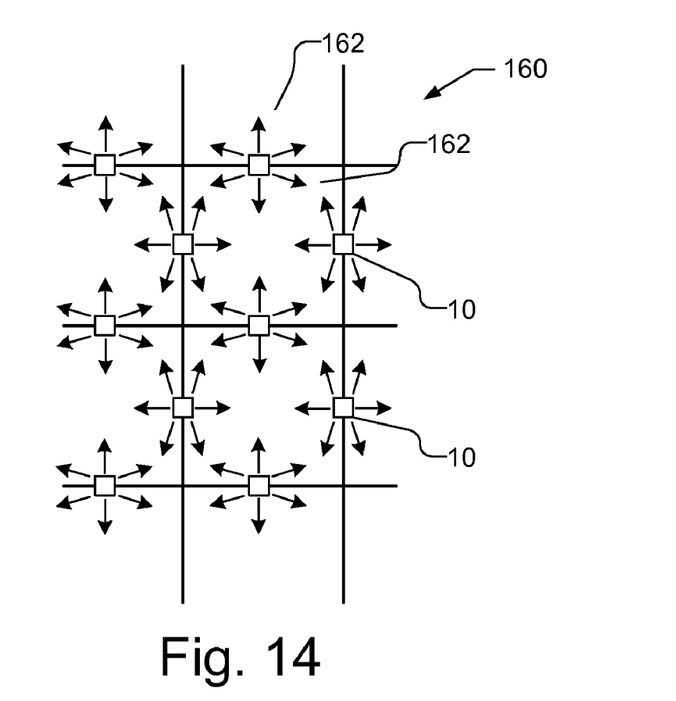
FIGS. 14 and 15 illustrate a plurality of cells in a backlight, similar to that shown in FIG. 13, with the LEDs located at the boundaries between cells.
Figure 15:
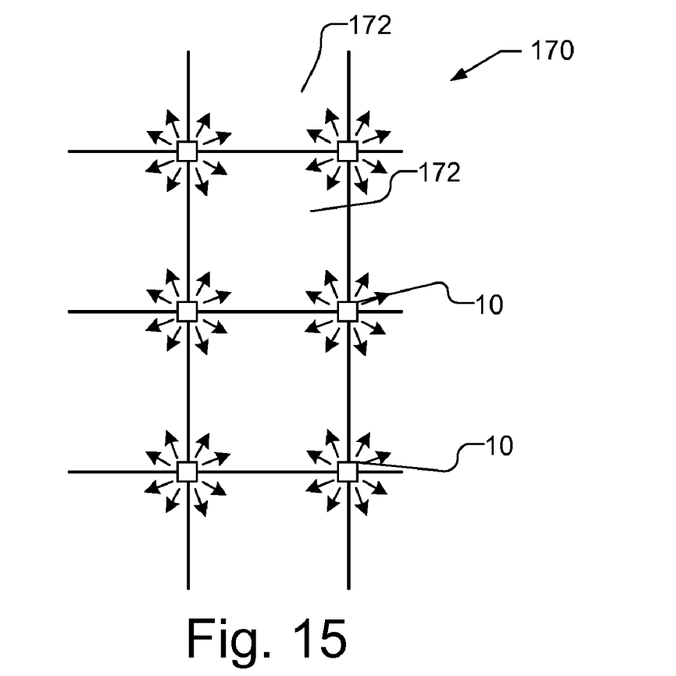

While the reflective cells 152 are illustrated as being square in FIG. 13, it should be understood that the cells can be formed into any desired shape. Moreover, design elements, such as optical shape, bottom reflector shape and specular and diffuse components, distance to diffuser element and patterning of the diffuser, may be controlled to adjust uniformity or light spreading issues as desired. Additionally, alternative placement of the LEDs within the cells may be used. By way of example, FIG. 14 illustrates a plurality of cells 162 in a backlight 160, similar to that shown in FIG. 13, except the LEDs 10 are located at the boundaries between two adjacent cells as opposed to being located in the center of the cell. Thus, the light from each LED 10 is divided between two primary cells, and each cell includes the light from four LEDs, thereby improving the light mixing in the cells. Similarly, FIG. 15 illustrates a plurality of cells 172 in a backlight 170 that is similar to the backlight 160 shown in FIG. 14, except the LEDs are located in the corners of each cell. Accordingly, the light from each LED is divided into four cells. Additionally, if desired, an LED 10 may be located in the center of each cell, so that light from five LEDs contribute to each cell 172.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
a side emitting, non-lasing light emitting diode (LED), the LED having a plurality of light emitting sidewalls, each light emitting sidewall having a top and a bottom,
the LED having a reflector formed over and covering its top surface such that the LED does not emit light from its top surface and emits light from its light emitting sidewalls without the use of a side-emitting lens,
the LED having anode and cathode electrodes formed on its bottom surface; and
a transparent optical element, each of the light emitting sidewalls of the LED being optically coupled to the optical element, the optical element having a light receiving entrance that is adjacent to the light emitting sidewalls of the LED, the optical element having a bottom edge, wherein light directed below the bottom edge of the optical element does not enter the optical element; wherein the bottom edge of the optical element is positioned at or below bottom edges of the light emitting sidewalls;
the apparatus further comprising:
a substrate on which the LED is mounted; and
a first silicone portion formed over the substrate and around the LED, a top surface of the first silicone portion having a curved share, the curved share sloping upward toward the LED and terminating below the light emitting sidewalls of the LED, the first silicone portion having a first index of refraction;
wherein the optical element comprising a second silicone portion formed over and abutting the tor surface of the first silicone portion, the second silicone portion having a second index of refraction higher than the first index of refraction such that there is total internal reflection of LED light at an interface of the first silicone portion and the second silicone portion.

2. The apparatus of claim 1, wherein the optical element is a reflector that redirects the side emitted light from the LED to forward directed light.

3. The apparatus of claim 2, wherein the LED is mounted on a molded lead frame and wherein a reflector shape is integrally formed from the molded lead frame, the reflector comprising a reflective coating over the integrally formed reflector shape in the molded lead frame.

4. The apparatus of claim 1, wherein the LED is mounted on an optically shaped lead frame, the lead frame is configured to form the shape of the optical element.

5. The apparatus of claim 1, wherein the optical element is a collimating lens, wherein each light emitting sidewall of the LED is optically coupled to an entrance area of the collimating lens.

6. The apparatus of claim 5, wherein the LED is mounted on a molded lead frame that has a shaped top surface that is shaped as a bottom surface of the collimating lens, the collimating lens being molded over the molded lead frame.

7. The apparatus of claim 6, wherein the shaped top surface is coated with a reflective layer.

8. The apparatus of claim 6, wherein the shaped top surface is coated with a material having a lower index of refraction than a material in the collimating lens.

9. The apparatus of claim 5, wherein the LED is mounted on a shaped substrate that is shaped as a bottom surface of the collimating lens, the collimating lens being molded over the shaped substrate, wherein the LED is mounted on the shaped substrate without an intervening submount.

10. The apparatus of claim 9, wherein the shaped top surface is coated with a reflective layer.

11. The apparatus of claim 9, wherein the shaped top surface is coated with a material having a lower index of refraction than a material in the collimating lens.

12. The apparatus of claim 5, wherein the collimating lens comprises two materials having different refractive indices.

13. The apparatus of claim 5, wherein the collimating lens has an entrance area through which light emitted by a sidewall of the LED is transmitted, the entrance area having the bottom edge and a top edge, wherein the top edge of the entrance area is positioned at or above the top of the light emitting sidewall.

14. The apparatus of claim 13, wherein the entrance area has angled walls along a length of the entrance area to redirect light emitted form the LED through a variety of angles.

15. The apparatus of claim 1, further comprising a submount having a top surface, the LED mounted on the top surface of the submount.

16. The apparatus of claim 15, wherein the bottom edge of the optical element is positioned at or below the top surface of the submount.

17. The apparatus of claim 15, wherein the submount comprises a plurality of sidewalls, each light emitting sidewall of the LED being aligned with a corresponding sidewall of the submount so that each light emitting sidewall is no more than 150 μm away from an edge of a corresponding sidewall of the submount.

18. The apparatus of claim 1, wherein the LED comprises:
a semiconductor light emitting device having contacts on a bottom surface that are mounted to the submount in a flip-chip configuration, the semiconductor light emitting device having a top surface;
a wavelength converting material over the top surface of the semiconductor light emitting device, the wavelength converting material having a top surface and sidewalls that are the side emitting sidewalls;
a reflector over the top surface of the wavelength converting material and being substantially parallel to the top surface of the semiconductor light emitting device so that substantially all light impinging on the reflector is redirected back into the wavelength converting material.

19. The apparatus of claim 18, wherein the wavelength converting material is a phosphor layer.

20. The apparatus of claim 5, wherein the LED emits white light.

21. The apparatus of claim 5, wherein the LED has a thickness less than 0.5 mm.

22. The apparatus of claim 1, further comprising a plurality of side emitting, non-lasing LEDs mounted with corresponding optical elements in an array; and a lightguide optically coupled to receive the side emitted light from the LEDs.

23. The apparatus of claim 22, farther comprising a liquid crystal layer overlying the lightguide for selectively controlling pixels in a display screen.

24. The apparatus of claim 1, further comprising a plurality of side emitting, non-lasing LEDs with corresponding optical elements in an array; and cellular walls surrounding each LED, each cellular wall being formed of a light diffusive material.

25. The apparatus of claim 24, wherein the light emitted from each LED is emitted primarily into two or more cells.

26. A light emitting device comprising:
a side emitting, non-lasing light emitting diode (LED), the LED having an active layer and a reflector layer overlying the active layer and a plurality of light emitting sidewalls between the active layer and the reflector layer, such that the LED does not emit light from its top surface and emits light from its light emitting sidewalls without the use of a side-emitting lens;
the LED having anode and cathode electrodes formed on its bottom surface; and
transparent optical element, the optical element having a light receiving entrance that is adjacent to the light emitting sidewalls of the LED such that each of the light emitting sidewalls of the LED is optically coupled to the optical element, an area between the active layer and a bottom surface of the reflector layer being wholly located within the light receiving entrance area of the optical element;
the apparatus further comprising:
a substrate on which the LED is mounted: and
a first silicone portion formed over the substrate and around the LED, a top surface of the first silicone portion having a curved share, the curved share sloping upward toward the LED and terminating below the light emitting sidewalls of the LED, the first silicone portion having a first index of refraction;
wherein the optical element comprising a second silicone portion formed over and abutting the tor surface of the first silicone portion, the second silicone portion having a second index of refraction higher than the first index of refraction such that there is total internal reflection of LED light at an interface of the first silicone portion and the second silicone portion.

27. The light emitting device of claim 26, wherein the optical element is a single reflector that redirects the side emitted light from the LED to forward directed light.

28. The light emitting device of claim 26, wherein the optical element is a collimating lens, wherein each light emitting sidewall of the LED is optically coupled to the collimating lens.

29. The light emitting device of claim 26, further comprising a submount upon which the LED is mounted, the submount having a plurality of sidewalls, each light emitting sidewall of the LED being aligned with a corresponding sidewall of the submount so that each light emitting sidewall is no more than 150 μm away from an edge of a corresponding sidewall of the submount.

30. The light emitting device of claim 26, wherein the LED further comprises a phosphor layer between the active layer and the reflective layer, the phosphor layer having a sidewalls that are the light emitting sidewalls.

31. The light emitting device of claim 26, further comprising a plurality of side emitting, non-lasing LEDs with a corresponding optical element in an array; and a lightguide optically coupled to receive the side emitted light from each of the LEDs.

32. The light emitting device of claim 31, further comprising a liquid crystal layer overlying the lightguide for selectively controlling pixels in a display screen.

33. The light emitting device of claim 26, further comprising a plurality of side emitting, non-lasing LEDs with a corresponding optical element in an array; and cellular walls surrounding each LED, each cellular wall being formed of a light diffusive material.

34. The light emitting device of claim 33, wherein the light emitted from each LED is emitted primarily into two or more cells.

35. An apparatus comprising:
a side emitting, non-lasing light emitting diode (LED), the LED having a plurality of light emitting sidewalls, each light emitting sidewall having a top and a bottom,
the LED having a reflector formed over and covering its top surface such that the LED does not emit light from its top surface and the LED emits light from its light emitting sidewalls without the use of a side-emitting lens,
the LED having anode and cathode electrodes formed on its bottom surface;
a molded lead frame, the LED being mounted on the molded lead frame, the molded lead frame having a contoured portion; and
a transparent optical element supported by the contoured portion of the molded lead frame, the optical element having its bottom surface dimensions defined by the contoured portion of the molded lead frame, the optical element having a light receiving entrance that is adjacent to the light emitting sidewalls of the LED so that each of the light emitting sidewalls of the LED is optically coupled with the optical element.

36. The apparatus of claim 35, wherein the optical element is a reflector that redirects the side emitted light from the LED to forward directed light.

37. The apparatus of claim 35, wherein the at least a portion of an optical element is the bottom surface of a collimating lens, the collimating lens being molded over the contoured portion of the molded lead frame.

38. The apparatus of claim 37, wherein the collimating lens comprises two materials having different refractive indices.

39. The apparatus of claim 35, wherein the at least a portion of an optical element is the bottom surface of a collimating lens, the collimating lens being molded over the contoured portion of the shaped substrate.

40. The apparatus of claim 39, wherein the collimating lens comprises two materials having different refractive indices.

41. The apparatus of claim 39, wherein the contoured portion of the shaped substrate is coated with a reflective layer.

42. The apparatus of claim 39, wherein the contoured portion of the shaped substrate is coated with a material having a lower index of refraction that a material in the collimating lens.

* * * * *